United States Patent
Kinyon et al.

(10) Patent No.: US 9,635,783 B2
(45) Date of Patent: Apr. 25, 2017

(54) ELECTRONIC COMPONENT HOUSING WITH HEAT SINK

(75) Inventors: Zachary Kinyon, Walnut Creek, CA (US); John Gannon, Holualoa, HI (US); Nick McKibben, Berkeley, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 143 days.

(21) Appl. No.: 13/436,723

(22) Filed: Mar. 30, 2012

(65) Prior Publication Data

US 2013/0255749 A1  Oct. 3, 2013

(51) Int. Cl.
| | | |
|---|---|---|
| *H01L 31/044* | (2014.01) | |
| *H05K 7/20* | (2006.01) | |
| *H02S 40/34* | (2014.01) | |
| *H01L 31/00* | (2006.01) | |
| *H01L 31/024* | (2014.01) | |
| *H01L 31/049* | (2014.01) | |

(52) U.S. Cl.
CPC ......... *H05K 7/2039* (2013.01); *H02S 40/345* (2014.12); *H01L 31/00* (2013.01); *H01L 31/024* (2013.01); *H01L 31/049* (2014.12); *Y02E 10/50* (2013.01)

(58) Field of Classification Search
CPC ........ H01L 31/00–31/078; Y02E 10/50–10/60
USPC ................................................ 136/243–265
See application file for complete search history.

(56) References Cited

U.S. PATENT DOCUMENTS

| | | |
|---|---|---|
| 5,951,785 A | 9/1999 | Uchihashi et al. |
| 7,595,976 B2 * | 9/2009 | Kato et al. ............ 361/641 |

(Continued)

FOREIGN PATENT DOCUMENTS

| | | |
|---|---|---|
| JP | 2007-166721 | 6/2007 |
| JP | 2009-302590 | 12/2009 |

(Continued)

OTHER PUBLICATIONS

Radox® Solar by Huber+Suhner, Edition 2010 Product Brochure in 58 pages.

(Continued)

*Primary Examiner* — Bach Dinh
(74) *Attorney, Agent, or Firm* — Oblon, McClelland, Maier & Neustadt, L.L.P.

(57) ABSTRACT

A photovoltaic assembly for converting solar radiation to electrical energy is described. The photovoltaic assembly includes a photovoltaic module and an electronic component housing. The photovoltaic module has a frame, a laminate, a plurality of solar cells and a backsheet. The electronic component housing has an upper section to couple to the backsheet, a middle section and a lower section for enclosing electronic components. The electronic components can include a microinverter or electronics for a junction box. The middle section can have a heat sink in thermal communication with the electronic component and an opening. The opening can be a plurality of openings having a plurality of air fins distributed therein, or can be a diagonal or curved structure. The opening can permit fluid communication between the heat sink and an ambient environment. The upper section and/or the aforementioned air fins can also be coupled to the backsheet via a heat conductive adhesive.

24 Claims, 19 Drawing Sheets

(56) References Cited

U.S. PATENT DOCUMENTS

| | | |
|---|---|---|
| 8,462,518 B2 | 6/2013 | Marroquin et al. |
| 8,659,880 B2 | 2/2014 | Russell et al. |
| 2006/0201544 A1* | 9/2006 | Inoue ............................ 136/251 |
| 2006/0207646 A1* | 9/2006 | Terreau et al. ............... 136/251 |
| 2007/0221267 A1* | 9/2007 | Fornage ........................ 136/244 |
| 2008/0135088 A1* | 6/2008 | Corrales ....................... 136/246 |
| 2008/0190477 A1* | 8/2008 | Hattori .......................... 136/246 |
| 2010/0294338 A1* | 11/2010 | Gibson et al. ................ 136/246 |
| 2012/0181973 A1* | 7/2012 | Lyden ........................... 320/101 |
| 2013/0003307 A1* | 1/2013 | Jang ............................. 361/709 |
| 2014/0168927 A1 | 6/2014 | Morris et al. |

FOREIGN PATENT DOCUMENTS

| | | | |
|---|---|---|---|
| KR | 10-2010-0007240 | | 1/2010 |
| KR | WO2011111915 | * | 9/2011 |
| KR | 10-2011-0128534 | | 11/2011 |
| WO | WO 2006-043325 | | 4/2006 |

OTHER PUBLICATIONS

PCT Search Report and Written Opinion of Sep. 27, 2013 for International Application No. PCT/US2013/033797 filed Mar. 26, 2013.

* cited by examiner

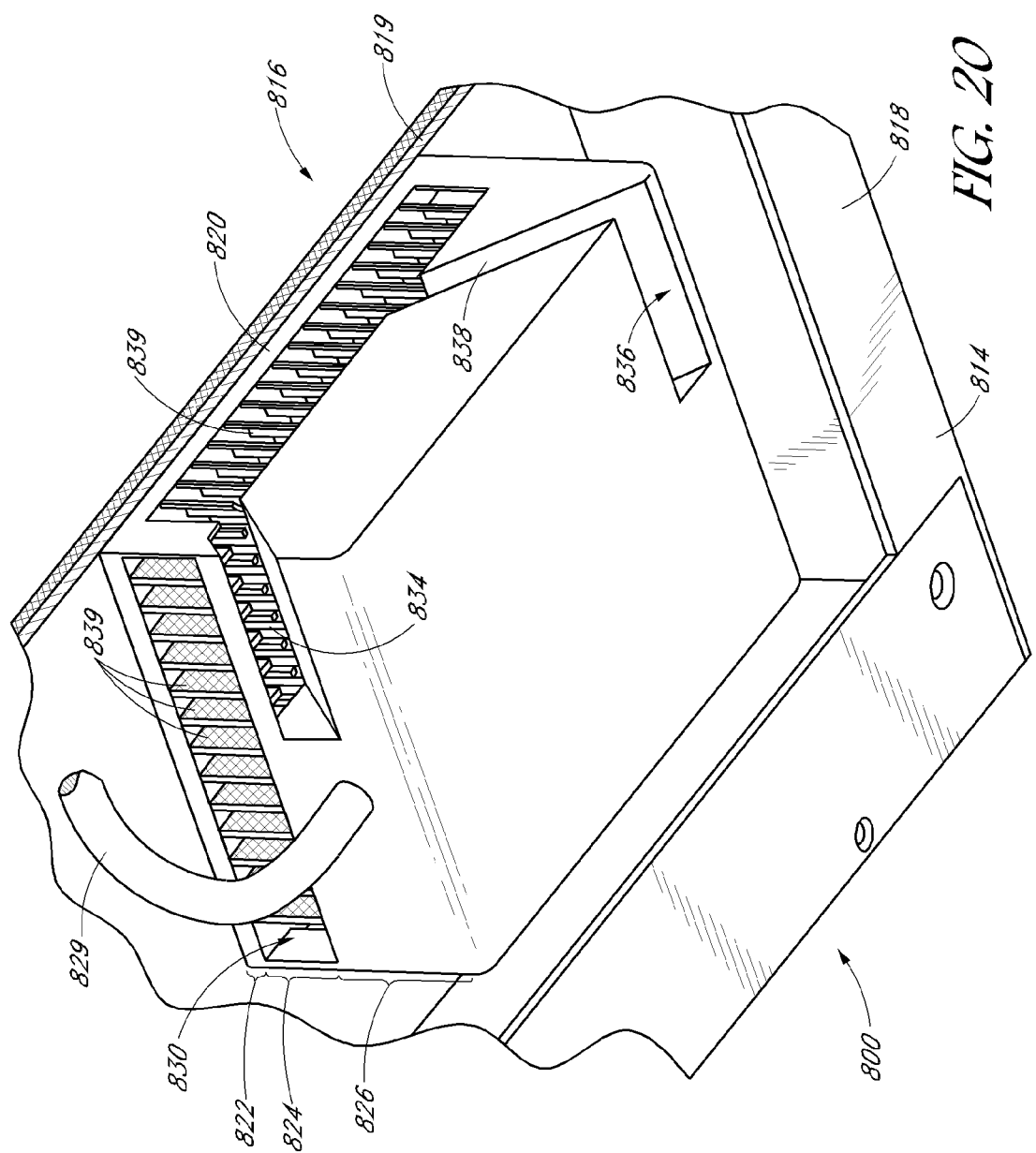

ELECTRONIC COMPONENT HOUSING WITH HEAT SINK

TECHNICAL FIELD

Embodiments of the subject matter described herein relate generally to photovoltaic assemblies including solar cells, photovoltaic modules and associated electronic components. More particularly, one or more embodiments of the present invention relate to photovoltaic modules, electronic housing components and heat sinks.

BACKGROUND

Solar cells are well known devices for converting solar radiation to electrical energy. Several solar cells can be connected to together to form a solar cell array. The solar cell array can be packaged into a photovoltaic (PV) module using various processes and encapsulant materials. Electronic components and wiring are required to convert, gather and transfer generated electric current. These electronic components are usually mounted close to the back of a photovoltaic module so that shipping density of the photovoltaic modules is not compromised. During operation, the electronic components can generate or trap heat which can cause the encapsulant materials to degrade at an accelerated rate. The heat can also permanently damage the cells inside photovoltaic module, or cause temporary performance degradation. One or more embodiments of the present invention pertain to photovoltaic assemblies that present alternative means of transferring heat from the electronics components to an ambient environment.

BRIEF DESCRIPTION OF THE DRAWINGS

A more complete understanding of the subject matter can be derived by referring to the detailed description when considered in conjunction with the following figures, wherein like reference numbers refer to similar elements throughout the figures.

FIG. 20 is a schematic cross-sectional diagram of the photovoltaic assembly of FIG. 19 in accordance with another embodiment;

DETAILED DESCRIPTION

Figure 1:
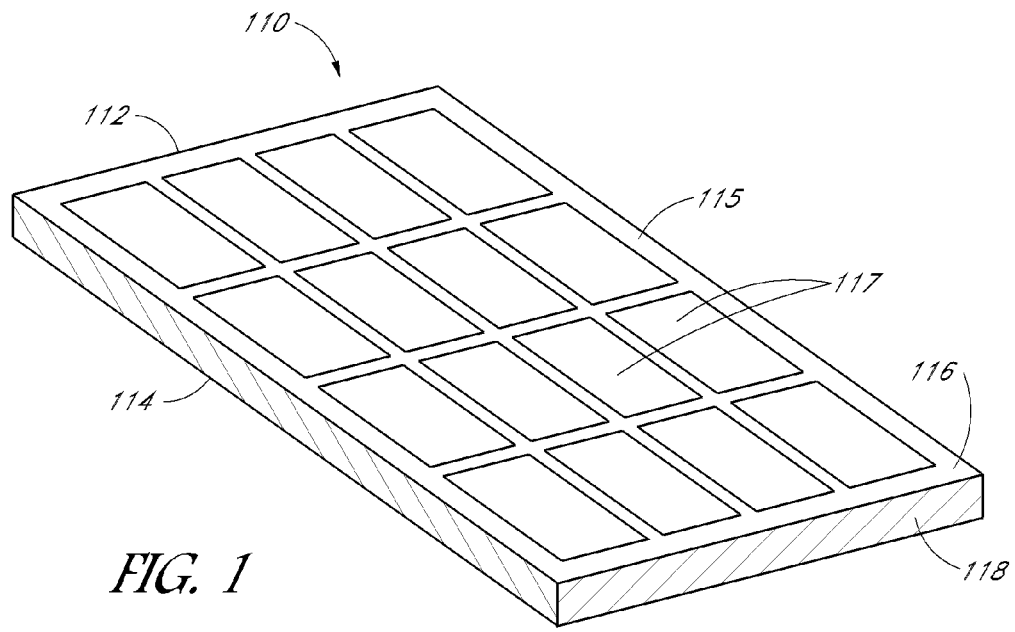
FIG. 1 is a schematic perspective view of a photovoltaic module in accordance with an embodiment of the present invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

In addition, certain terminology can also be used in the following description for the purpose of reference only, and thus is not intended to be limiting. For example, terms such as "upper", "middle", and "lower" refer to directions in the drawings to which reference is made. Terms such as "front" and "back" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import. Similarly, the terms "first", "second", and other such numerical terms referring to structures do not imply a sequence or order unless clearly indicated by the context.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

A photovoltaic assembly for converting solar radiation to electrical energy is disclosed herein. The photovoltaic assembly has a photovoltaic module and an electronic component housing. The photovoltaic module can have a front side that faces the sun during normal operation and a back side, opposite the front side. The photovoltaic module can have a frame, a laminate, a plurality of solar cells on the front side disposed within the laminate, and thus within the photovoltaic module, and a backsheet disposed on the back side. The electronic component housing can have an upper portion coupled to the backsheet, a lower portion enclosing an electronic component and a middle portion. The middle portion of the electronic component housing can include a heat sink in thermal communication with the electronic component and an opening. The opening in the electronic component housing can be in between the upper portion and lower portion, permitting fluid communication between the heat sink and an ambient environment.

Another photovoltaic assembly for converting solar radiation to electrical energy is also disclosed herein. The photovoltaic assembly has a photovoltaic module and an electronic component housing. The photovoltaic assembly can have a front side that faces the sun during normal operation and a back side, opposite the front side. The photovoltaic module can have, a laminate, a plurality of solar cells on the front side disposed within the laminate, and thus within the photovoltaic module, and a backsheet disposed on the back side. The electronic component housing can have an upper portion coupled to the backsheet of the photovoltaic module, a lower portion enclosing an electronic component and a middle portion. The middle portion of the electronic component housing can include a heat sink in thermal communication with the electronic component and an opening. The opening in the housing can originate from the lower portion and end in between the upper portion and lower portion, permitting fluid communication between the heat sink and an ambient environment.

Yet another photovoltaic assembly for converting solar radiation to electrical energy is also disclosed herein. The photovoltaic assembly has a photovoltaic module and an electronic component housing. The photovoltaic module can have a front side that faces the sun during normal operation and a back side, opposite the front side. The photovoltaic module can have a frame, a laminate, a plurality of solar cells on the front side disposed within the laminate, and thus within the photovoltaic module, and a backsheet disposed on the back side. The electronic component housing can have a lower portion enclosing an electronic component, an upper portion and a middle portion. The upper portion can have an L-shaped structure extending from the lower portion and bending inward to couple to the backsheet. The middle portion can have a heat sink. The heat sink can be in thermal communication with the electronic component. The middle portion can also have an opening in the electronic component housing, between the upper portion and lower portion. The opening permits fluid communication between the heat sink and an ambient environment. The middle portion can further have a plurality of air fins extending from the lower portion of the electronic component housing to contact the backsheet, between the L-shaped structure, allowing heat transfer from the backsheet to the heat sink.

As used herein, unless expressly stated otherwise, "coupled" means that one element/node/feature is directly or indirectly joined to (or directly or indirectly communicates with) another element/node/feature, and not necessarily mechanically coupled.

FIGS. 1-20 illustrate various embodiments of a photovoltaic assembly for converting solar radiation to electrical energy. Numerous specific details are provided, such as examples of apparatuses and components to provide a thorough understanding of at least some embodiments of the present invention. It is to be understood, however, that other embodiments of the present invention can be practiced without one or more of the specific details set forth. In other instances, well-known details are not shown or described in order to avoid obscuring aspects of certain embodiments of the present invention.

FIG. 1 illustrates a photovoltaic module 110 having a front side 112 that faces the sun during normal operation and a back side 114 opposite the front side 112. In some embodiments, the photovoltaic module 110 has a frame 118 and a laminate 116 containing a plurality of solar cells 117. The solar cells 117 face the front side 112. The laminate 116 can include one or more encapsulating layers 111 which surround and enclose the solar cells 117. A cover 115 made of glass or another transparent material can be laminated to the encapsulating layers 111. In certain embodiments, the material chosen for construction of the cover 115 can be selected for properties which minimize reflection, thereby permitting the maximum amount of sunlight to reach the solar cells 117. The cover 115 can provide structural rigidity to the laminate 116. The laminate 116 can also have a backsheet 119. The backsheet 119 can be a weatherproof and electrically insulating layer which protects the underside of the laminate 116. The backsheet 119 can be a polymer sheet, and it can be laminated to the encapsulant layer(s) 111 of the laminate 116, or it can be integral with one of the layers of the encapsulant 111.

Figure 2:
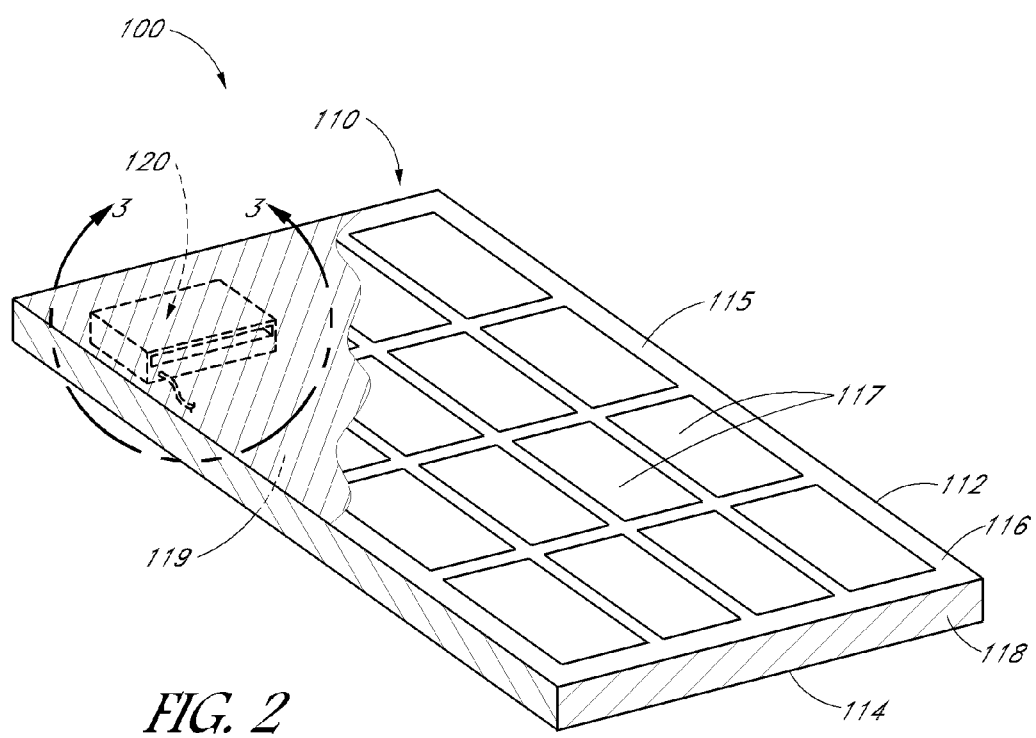
FIG. 2 is a schematic perspective view of a photovoltaic assembly in accordance with an embodiment.

With reference to FIG. 2, a photovoltaic assembly 100 for converting solar radiation to electrical energy is shown. The photovoltaic assembly 100 can have a photovoltaic module 110 similar to the photovoltaic assembly 110 described in association with FIG. 1. The photovoltaic assembly 100 also has an electronic component housing 120 coupled to the backsheet 119. Although a photovoltaic module 110 is shown in FIG. 2, the photovoltaic assembly 110 can alternatively include a photovoltaic concentrator and an electronic component housing in another embodiment.

Figure 3:
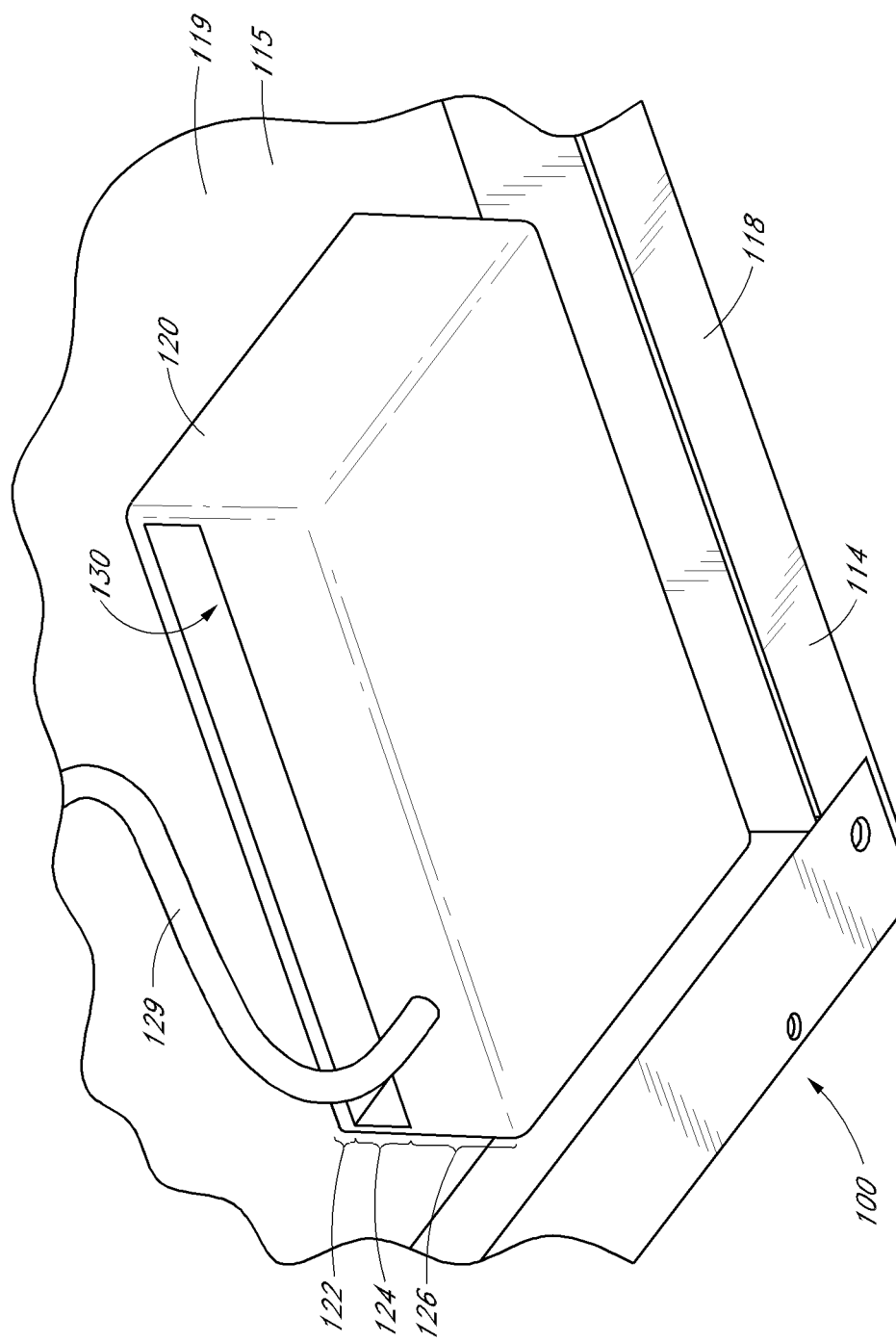
FIG. 3 is a schematic perspective view of the electronic component housing of FIG. 2 in accordance with an embodiment.

FIG. 3 illustrates a schematic perspective view of the electronic component housing 120 described in FIG. 2. The electronic component housing 120 has an upper portion 122, a middle portion 124 and a lower portion 126. The upper portion is coupled to the back side 114 of the photovoltaic module 110 on the backsheet 119. Although the schematic shown in FIG. 3 depicts one exemplary arrangement of elements, additional intervening elements, devices, features, or components can be present in one or more embodiments of the present invention.

Figure 4:
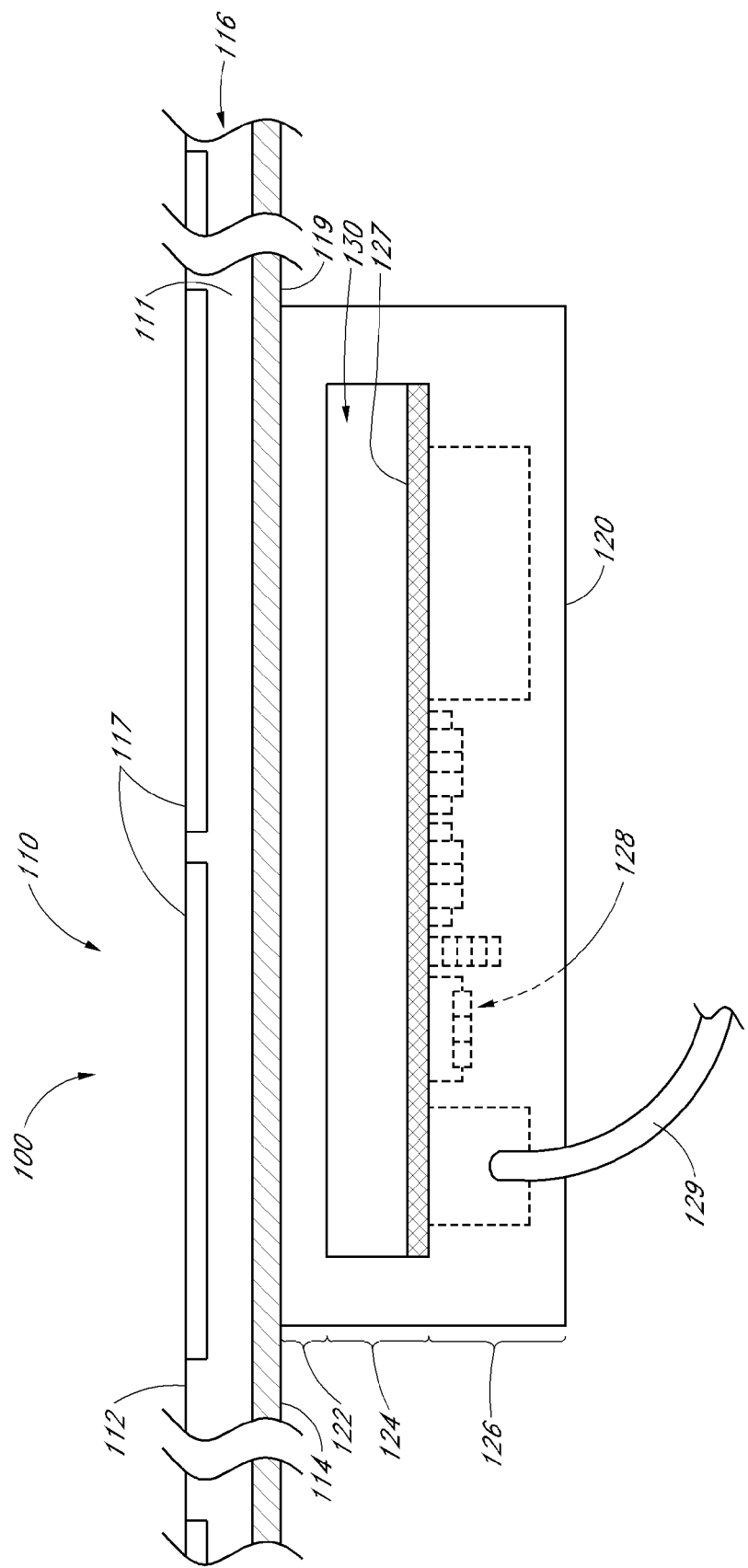
FIG. 4 is a schematic cross-sectional diagram of the electronic component housing of FIG. 3 in accordance with an embodiment.

With additional reference to FIG. 4, the middle portion 124 of the electronic component housing 120 includes an opening 130 which can be a through-hole, an opening on one end which extends through to the other end of the electronic component housing 120. The opening 130 can permit heat transfer between the heat sink 127 and the ambient environment. The ambient environment is the open air above and below the photovoltaic module 110. The opening 130 can also allow for air flow between the laminate 116 and electronic components housed in the electronic component housing 120, effectively cooling the electronic component housing 120 and allowing heat to escape. An electronic cable 129 can be included and used for outputting electricity produced by the photovoltaic assembly 100.

The heat sink 127 is a device which receives, directs, and spreads thermal energy. The heat sink 127 can be composed of a material with high thermal conductivity, such as copper, aluminum, or another metal. It can also be composed of a material not well-known for thermal conductivity if the other material is more suitable for other reasons like cost, availability, dielectric properties, or other design constraints in the electronic component housing 120. The heat sink 127 thermally communicates directly with the electronic component 128 and, in some embodiments, can be integrally formed with the electronic component housing 120. It can distribute and exchange heat through its surface features and geometric shape. Such shapes and features can include fins of any type, size, or arrangement, including planar elements, cylindrical extensions, and so on. The fins of a heat sink can be referred to as air fins herein, although they are integrally formed with other components of the heat sink 127. The fins can direct air flow, in addition to increasing the rate of heat transfer from the heat sink 127 to the environment. The heat sink 127 can have fins disposed between two rectangular prisms, projecting from one or several surfaces, and other configurations. The planar surface of the fins can be aligned to expected airflow or perpendicular to it, or any intermediate configuration.

In an embodiment, the electronic component housing 120 is composed of aluminum. In another embodiment, the electronic component housing 120 is composed of a heat dissipating polymer. In an embodiment, the backsheet 119 of the photovoltaic module 110 is fabricated from a glass or a plastic polymer.

Although it is shown in FIG. 2 that the electronic component housing 120 is mounted on the corner of the photovoltaic module 110, the electronic component housing 120 can be mounted at other suitable locations, such as a location anywhere at the back side 114 of the photovoltaic module 110. The electronic component housing 120 can be mounted directly and solely to the backside 114 of the photovoltaic laminate 116, such as mounted to the backsheet 119. Thus, although illustrated embodiments comprise frame 118, in other embodiments, the frame 118 can be omitted and the photovoltaic laminate 116 can be supported by non-frame elements while still including the improved electronic component housing described herein. In those embodiments comprising a frame, the electronic component housing 120 can be additionally coupled to the frame 118 along one or several sides of the housing 120 or frame 118.

Figure 5:
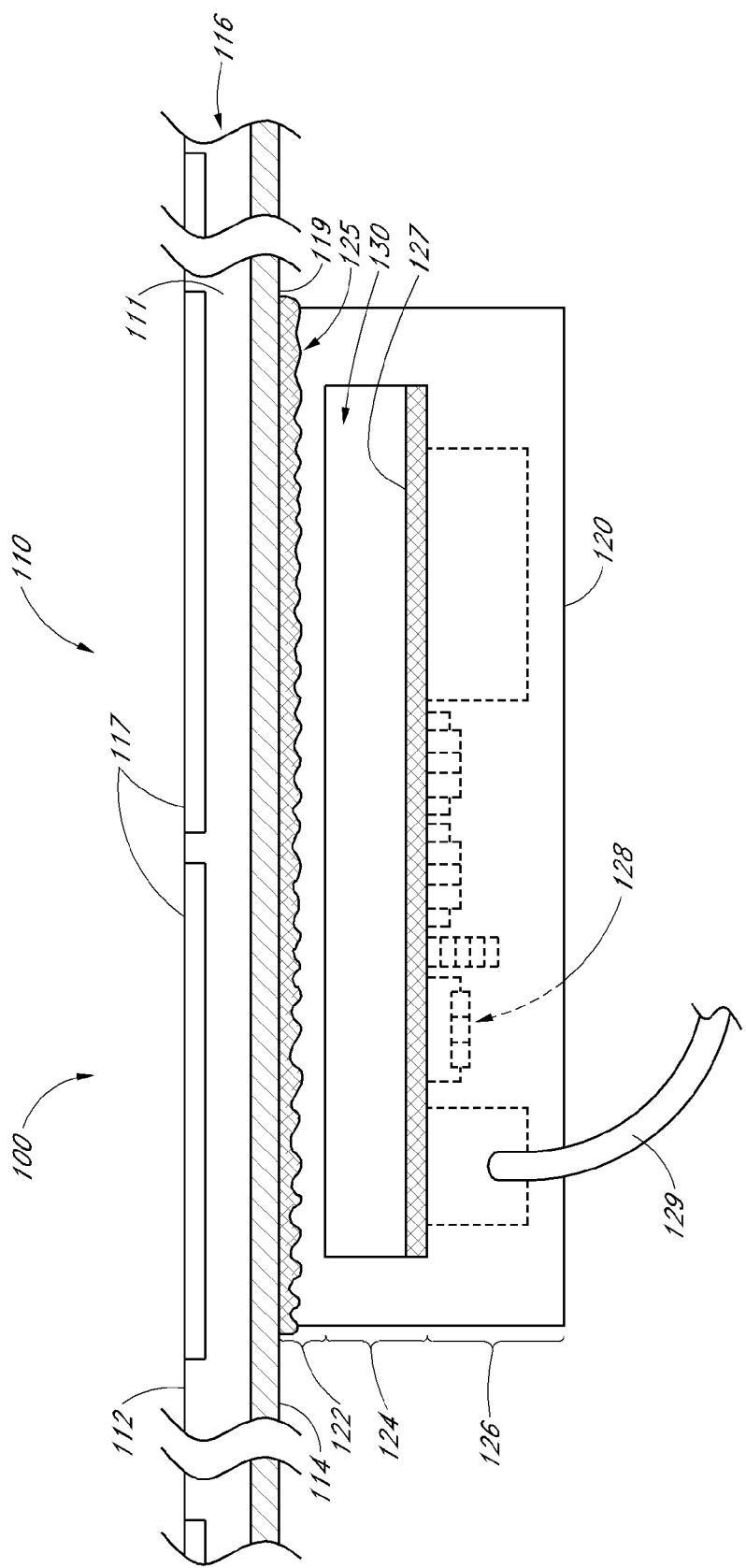
FIG. 5 is a schematic cross-sectional diagram of a photovoltaic assembly in accordance with yet another embodiment.

With continued reference to FIG. 4 and additional reference to FIG. 5, schematic cross-sectional diagrams of the photovoltaic assembly 100 are shown. The electronic component housing 120 has an upper portion 122, middle portion 124 and lower portion 126. The upper portion is coupled to the back side 114 of the photovoltaic module 110 through the backsheet 119. The middle portion can include a heat sink 127 and an opening 130. The lower portion 126 encloses an electronic component 128. Alternatively, the electric component 128 can be distributed partially or entirely in either or both of the upper and lower 122, 126 portions of the electronic component housing 120. Thus, that at least some of the constituent elements of the electronic component 128 can be present in any of the upper, middle, or lower portions 122, 124, 126 of the electronic component housing 120. The heat sink 127 can also be on the upper, lower, or both upper and lower portion of the opening 130. The electronic component 128 can be a microinverter which can be used to convert the output current of the photovoltaic assembly 100 from direct current (DC) to alternating current (AC) and outputting AC, since most homes and facilities use AC. In another embodiment, the electronic component 128 includes a junction box or the electronic components of a photovoltaic module junction box. In yet another embodiment, the electronic component 128 includes a DC to DC optimizer or other distributed power conditioning electronic device.

In yet another embodiment, a thermally-conductive adhesive 125 is placed between the backsheet 119 and the upper portion 122 of the electronic component housing 120, as depicted in FIG. 5. The thermally-conductive adhesive 125 can be provided to keep the electronic component housing 120 secured to the backsheet 119. In one embodiment, the thermally-conductive adhesive 125 is used to absorb and/or transfer heat from the backsheet 119 so that heat is transported from either or both of the backsheet 119 and the electronic component housing 120, though not necessarily in even amounts, to the environment through the heat sink 127. In another embodiment the adhesive can have relatively higher thermal insulation characteristics, and can be used to insulate the photovoltaic module 110 from heat generated in the electronic component housing 120. Advantageously, damage caused by heat transferred from the electronic component housing 120 and travelling into the photovoltaic laminate 116 is inhibited.

Figure 6:
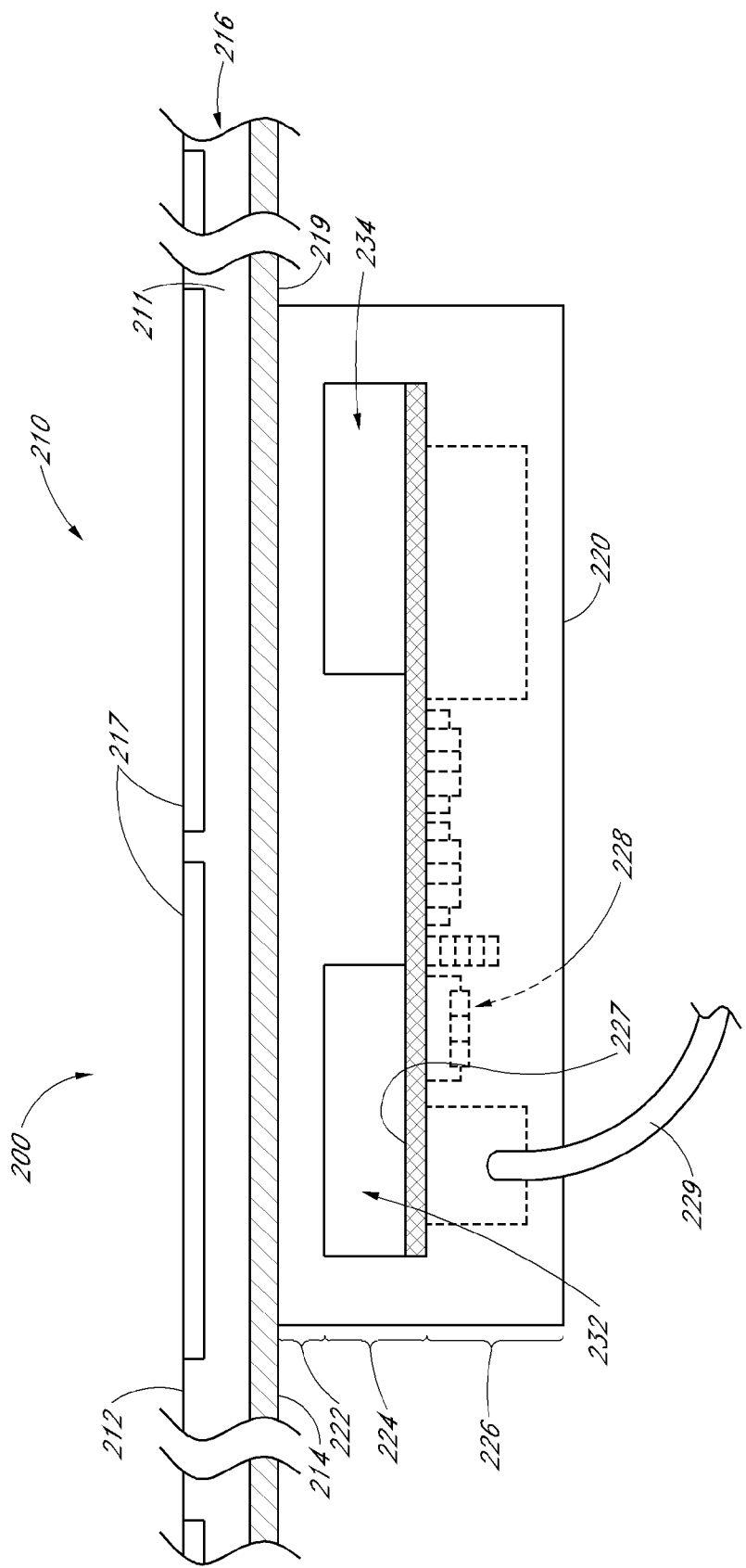
FIG. 6 is a schematic cross-sectional diagram of a photovoltaic assembly in accordance with still another embodiment.

With reference to FIG. 6, a schematic cross-sectional diagram for another embodiment of a photovoltaic assembly 200 is shown. Unless otherwise specified below, the numeric indicators used to refer to components in FIGS. 1-5 are similar to the components in FIGS. 6-20, except that the index has been incremented in increasing units of 100.

Similar to FIGS. 1-5, the photovoltaic assembly 200 includes a photovoltaic module 210 having a front side 212, a back side 214, a frame, a laminate 216, a plurality of solar cells 217 and a backsheet 219. The electronic component housing 220 has an upper portion 222 coupled to the backsheet 119 and a lower portion 226 enclosing an electronic component. The middle portion 224 of the electronic component housing 220 includes a first opening 232 and a second opening 234. Although not shown, an electronic component can be disposed between the first opening 232 and the second opening 234 or distributed within the upper, middle, and lower portions 222, 224, 226 of the electronic component housing. Furthermore, although only two openings are depicted, additional openings can be included, possibly defining additional regions for disposing an electronic component.

Figure 7:
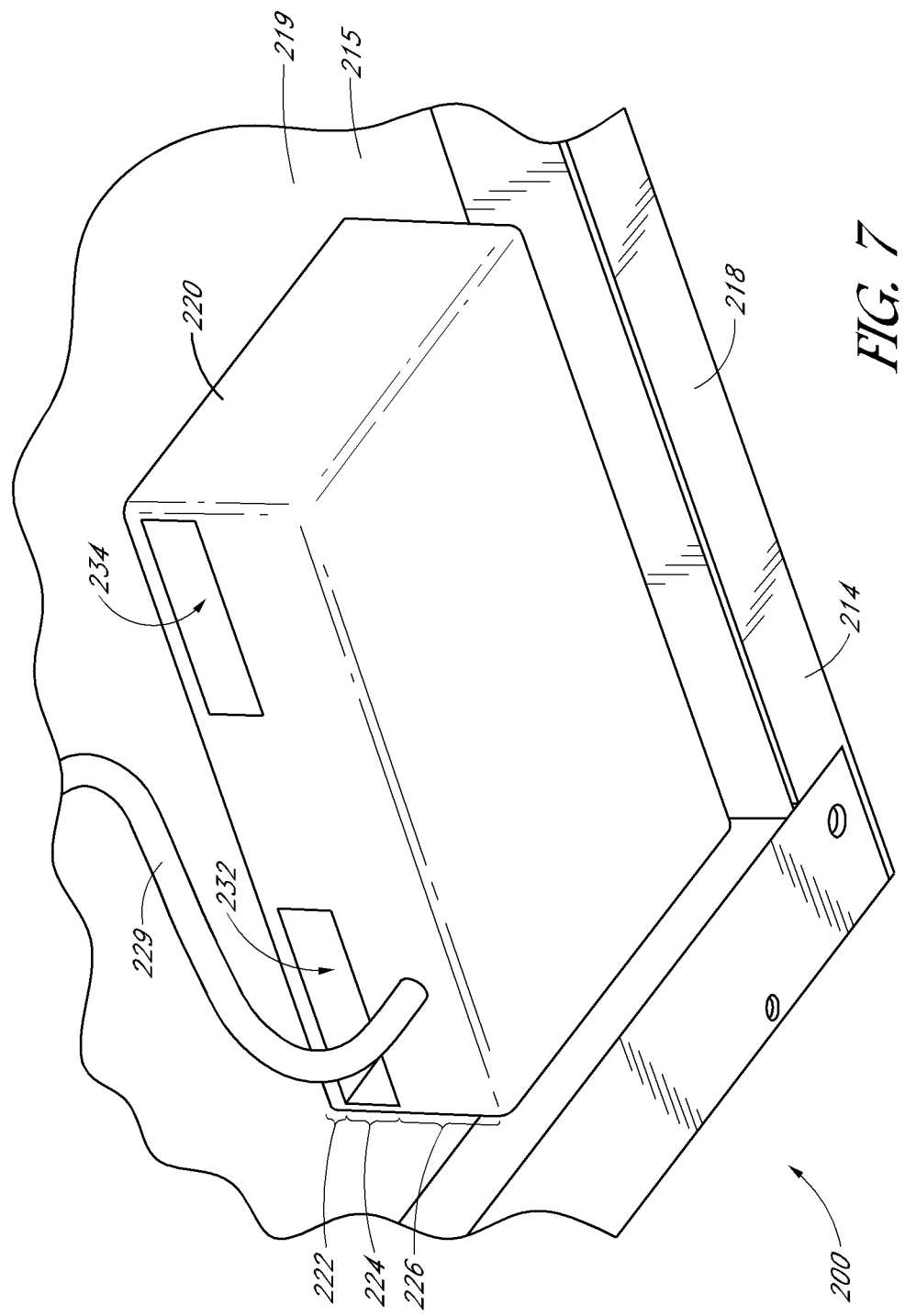
FIG. 7 is a schematic perspective view of the photovoltaic assembly of FIG. 6 in accordance with still another embodiment.

FIG. 7 illustrates a schematic perspective view of the photovoltaic assembly 200. A frame 218 is depicted, along with backsheet 219 and electronic component housing 220. The upper portion 222, middle portion 224 and lower portion 226 of the electronic component housing 220 enclosing an electronic component are also shown. The first 232 and second openings 234 are included in the middle portion 224 of the electronic component housing 220.

Figure 8:
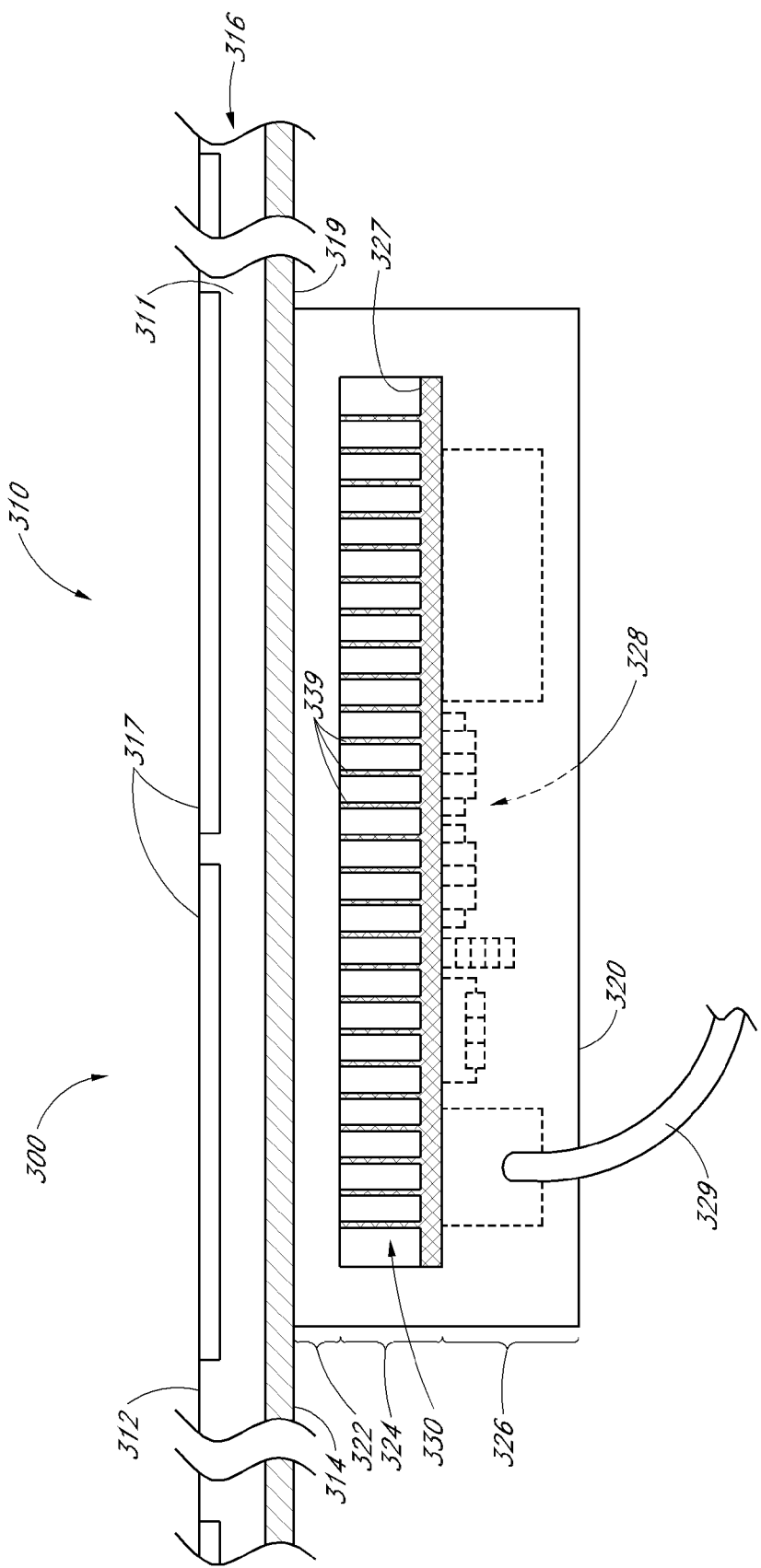
FIG. 8 is a schematic cross-sectional diagram of a photovoltaic assembly in accordance with yet another embodiment.

With reference to FIG. 8, a schematic cross-sectional diagram for another embodiment of a photovoltaic assembly 300 is shown. Photovoltaic assembly 300 is similar to the assemblies described in association with FIGS. 1-5, with the addition of air fins 339 disposed within the heat sink 327 found in the middle portion 324 of the electronic component housing 320. In one embodiment, the air fins 339 extend from the lower portion 326 to contact the upper portion 322. In one such embodiment, the air fins 339 allow additional paths for air flow and fluid thermal communication between the heat sink 327 and an ambient environment. The air fins 339 also promote and contribute to cooling of the electronic component housing 320 as described above. In certain embodiments, the air fins 339 can extend only partially between the upper and lower portions 322, 324, and thus only partially across the middle portion 324. In such embodiments, the air fins 339 do not contact the upper portion 322.

Figure 9:
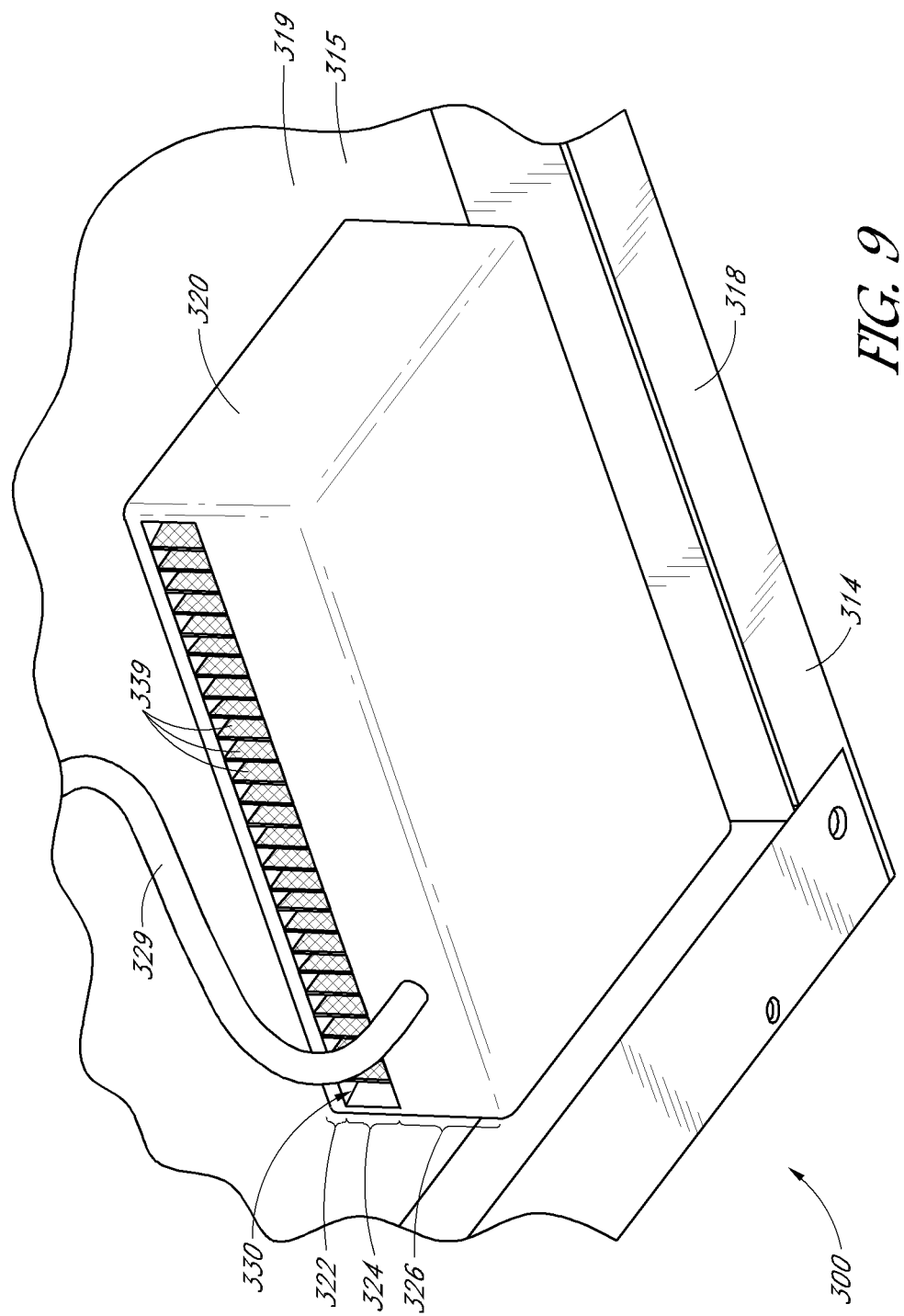
FIG. 9 is a schematic perspective view of the photovoltaic assembly of FIG. 8 in accordance with yet another embodiment.

FIG. 9 illustrates a schematic perspective view of the photovoltaic assembly 300 described in association FIG. 8, wherein the air fins 339 within the middle portion 324 are shown.

Figure 10:
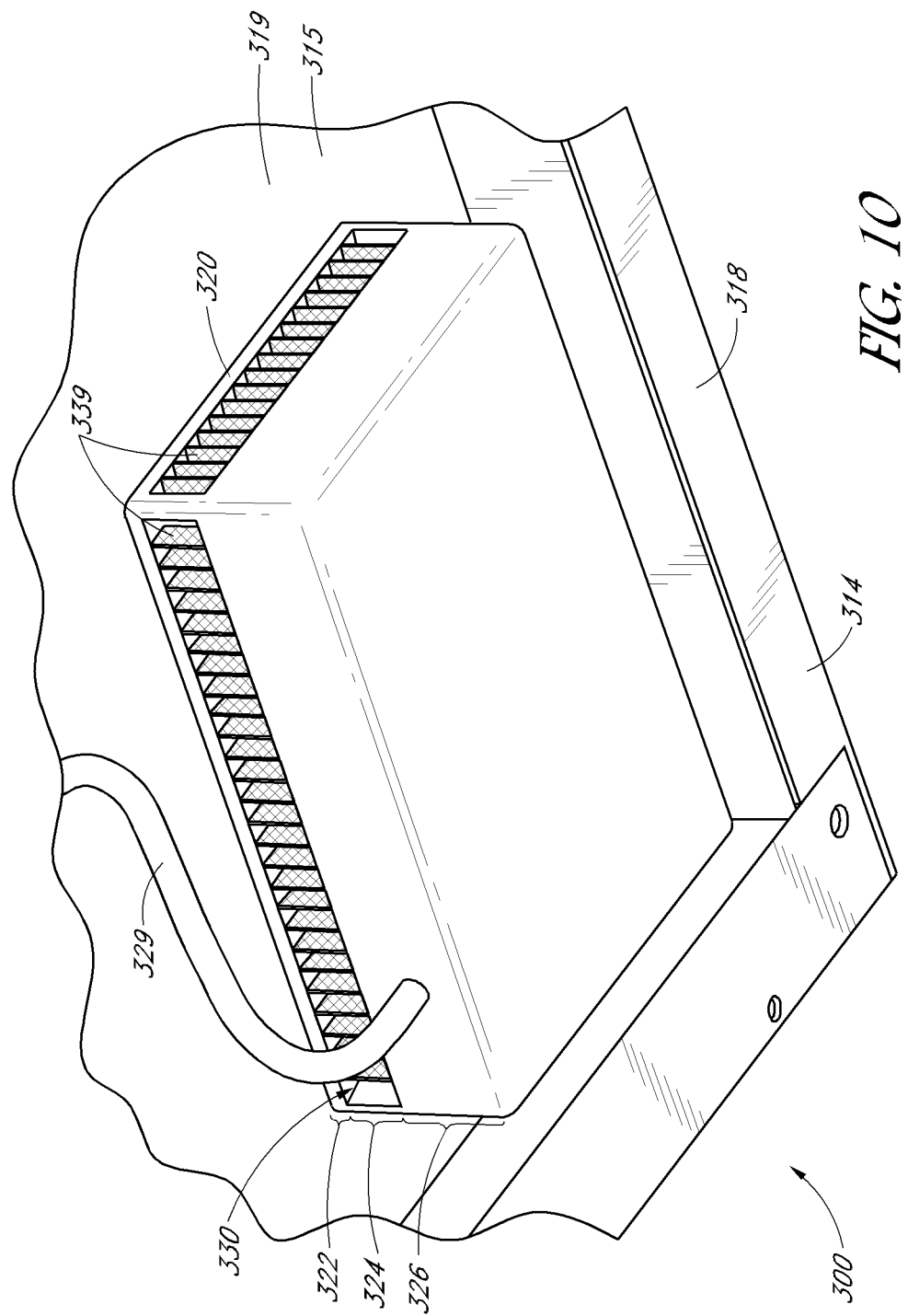
FIG. 10 is a schematic perspective view of a photovoltaic assembly in accordance with another embodiment.

With reference to FIG. 10, a perspective view for yet another embodiment of a photovoltaic assembly 300 is shown. Referring to the above, the photovoltaic assembly 300 depicted in FIG. 10 is similar to the assemblies described in association with FIG. 8, with the exception that the middle portion 324 includes of air fins 339 within an opening 830 along all sides of the electronic component housing 320. The air fins 339 can act as heat-directing channels from the heat sink 327 to an ambient environment, as described above. The opening 830 can also be present on any number of sides of the electronic component housing 320, whether one, all, or any number in between. Additionally, numerous smaller openings can be substituted for opening 830, resulting in a grill, mesh, or series of ports opening in the side of the electronic component housing 320.

Figure 11:
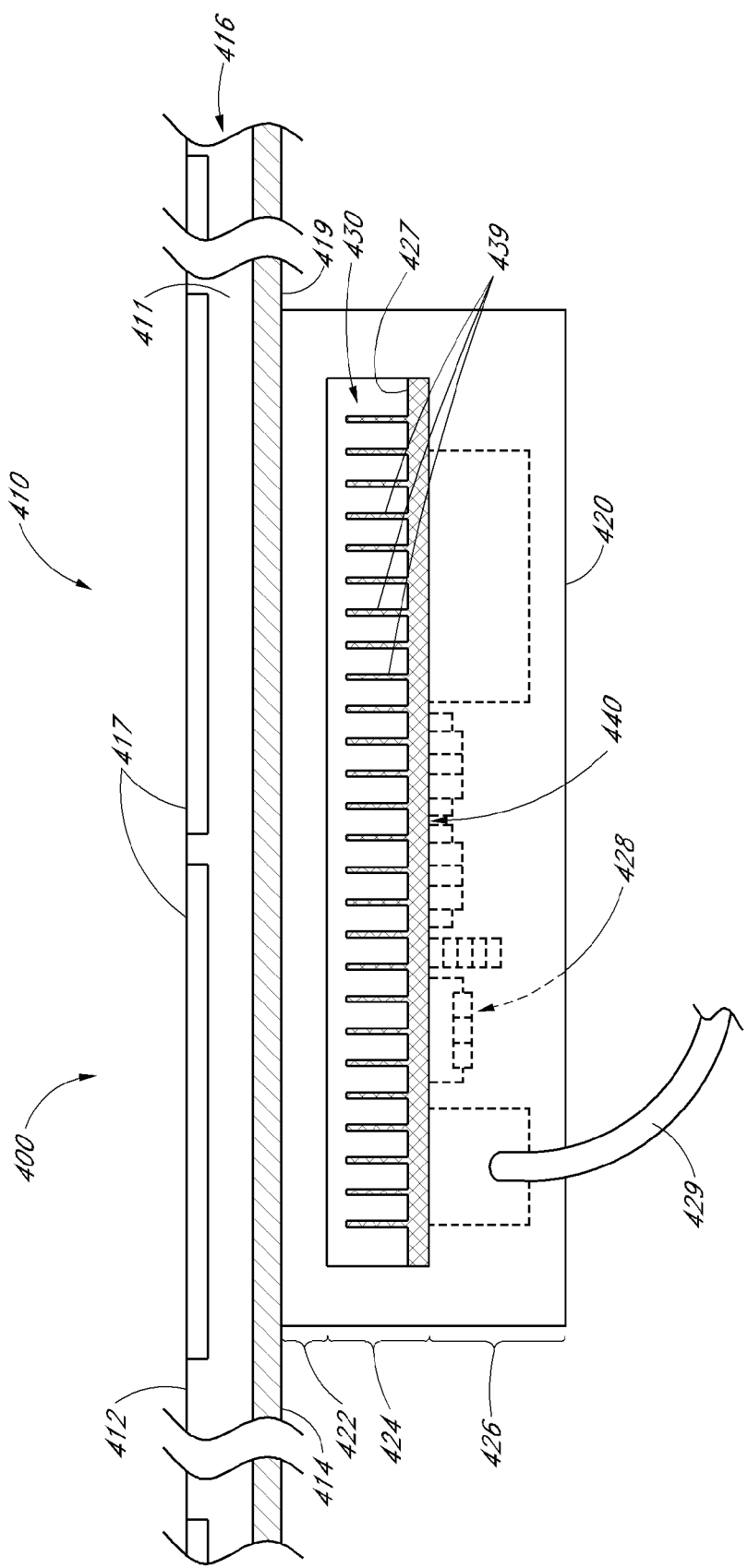
FIG. 11 is a schematic cross-sectional diagram of a photovoltaic assembly in accordance with still another embodiment.

With reference to FIG. 11, a schematic cross-sectional diagram for still another embodiment of a photovoltaic assembly 400 is depicted. The photovoltaic assembly 400 shown in FIG. 11 is similar to the assemblies described in association with FIGS. 8-10. However, an electronic component housing 420 has an opening 430 with air fins 439 which extend from the surface of the heat sink 427 toward the upper portion 422 of the electronic component housing 420 without touching the upper portion 422.

Figure 12:
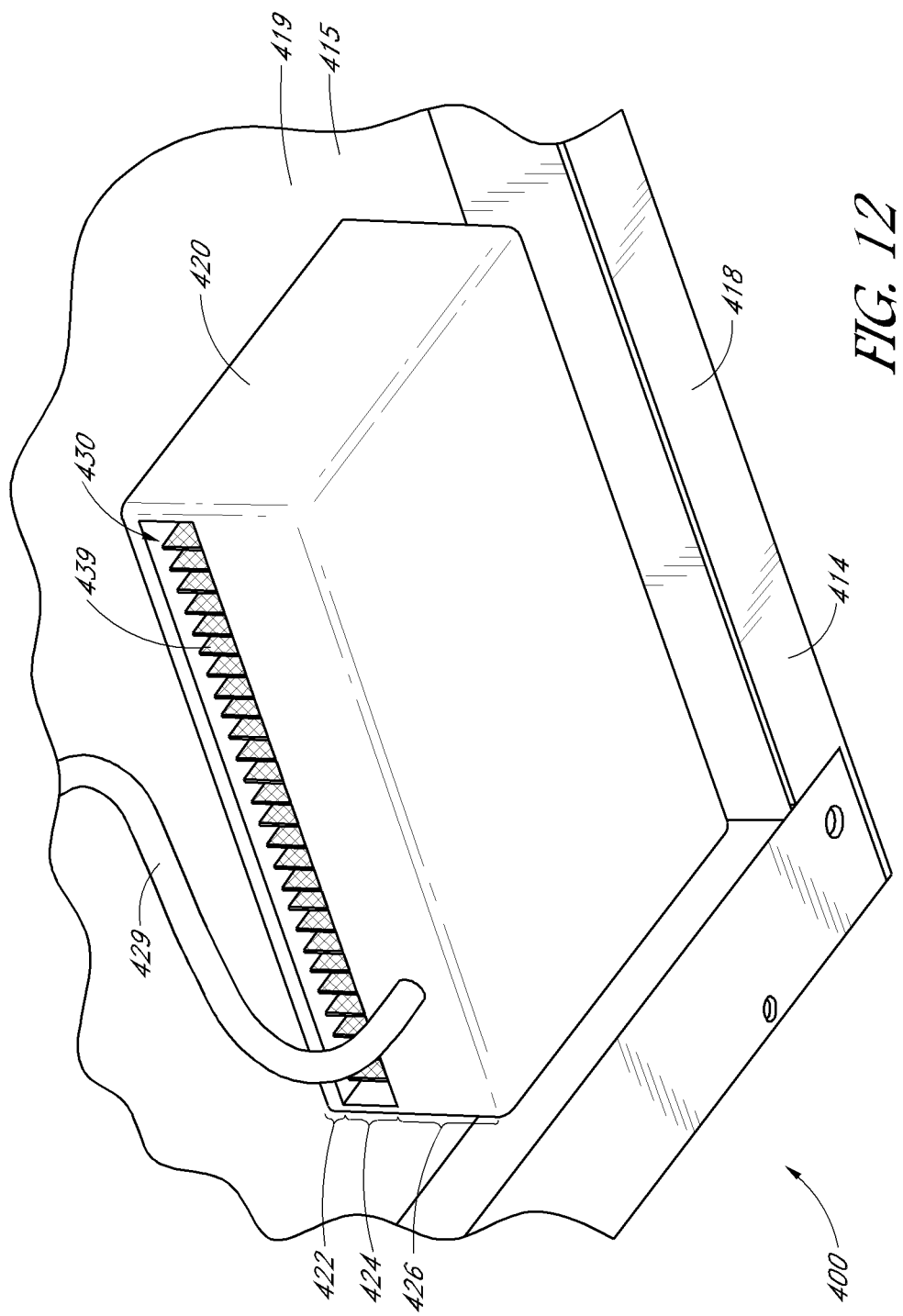
FIG. 12 is a schematic perspective view of the photovoltaic assembly of FIG. 11 in accordance with still another embodiment.

FIG. 12 illustrates a schematic perspective view for an embodiment of the photovoltaic assembly 400. The air fins 439 are depicted as positioned in the opening 430.

Figure 13:
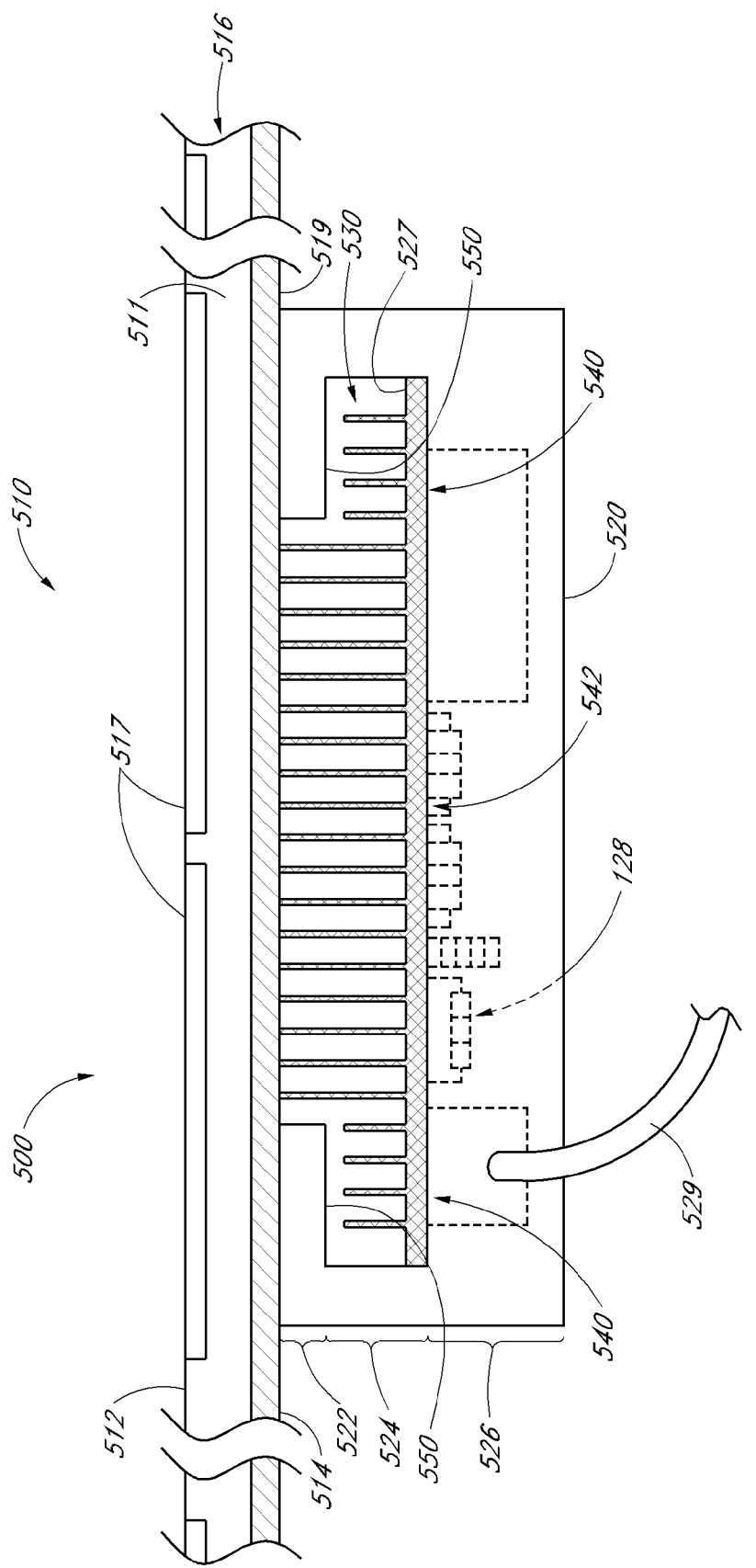
FIG. 13 is a schematic cross-sectional diagram of a photovoltaic assembly in accordance with another embodiment.

With reference to FIG. 13, a schematic cross-sectional diagram for yet another embodiment of a photovoltaic assembly 500 is shown. The photovoltaic assembly 500 includes an upper portion 522 having an L-shaped structure 550 extending from the lower portion 526 of an electronic component housing 520 and bending inward to couple to a backsheet 519 of a photovoltaic module 510. The middle portion 524 of the electronic component housing 520 can include a first set of air fins 539 and a second set of air fins 542 disposed within a heat sink 527 positioned in an opening 530. In an embodiment, the second set of air fins 542 extends from the lower portion 526 of the electronic component housing 520 to contact the backsheet 519, between the L-shaped structure 550, allowing for heat to transfer from the backsheet 519 to the heat sink 527. Due to the L-shaped structure 550 extending from the lower 526 portion and bending inward, the first set of air fins 539 extends without touching the backsheet 519. Although in some embodiments, such as the illustrated embodiment, the first set of air fins 539 does not contact the L-shaped structures 550, in other embodiments, the first set of air fins 539 can contact the L-shaped structure 550. The L-shaped structure 550 can, in some embodiments, be constructed to permit effective thermal communication between the backsheet 519 and the first set of air fins 539.

Figure 14:
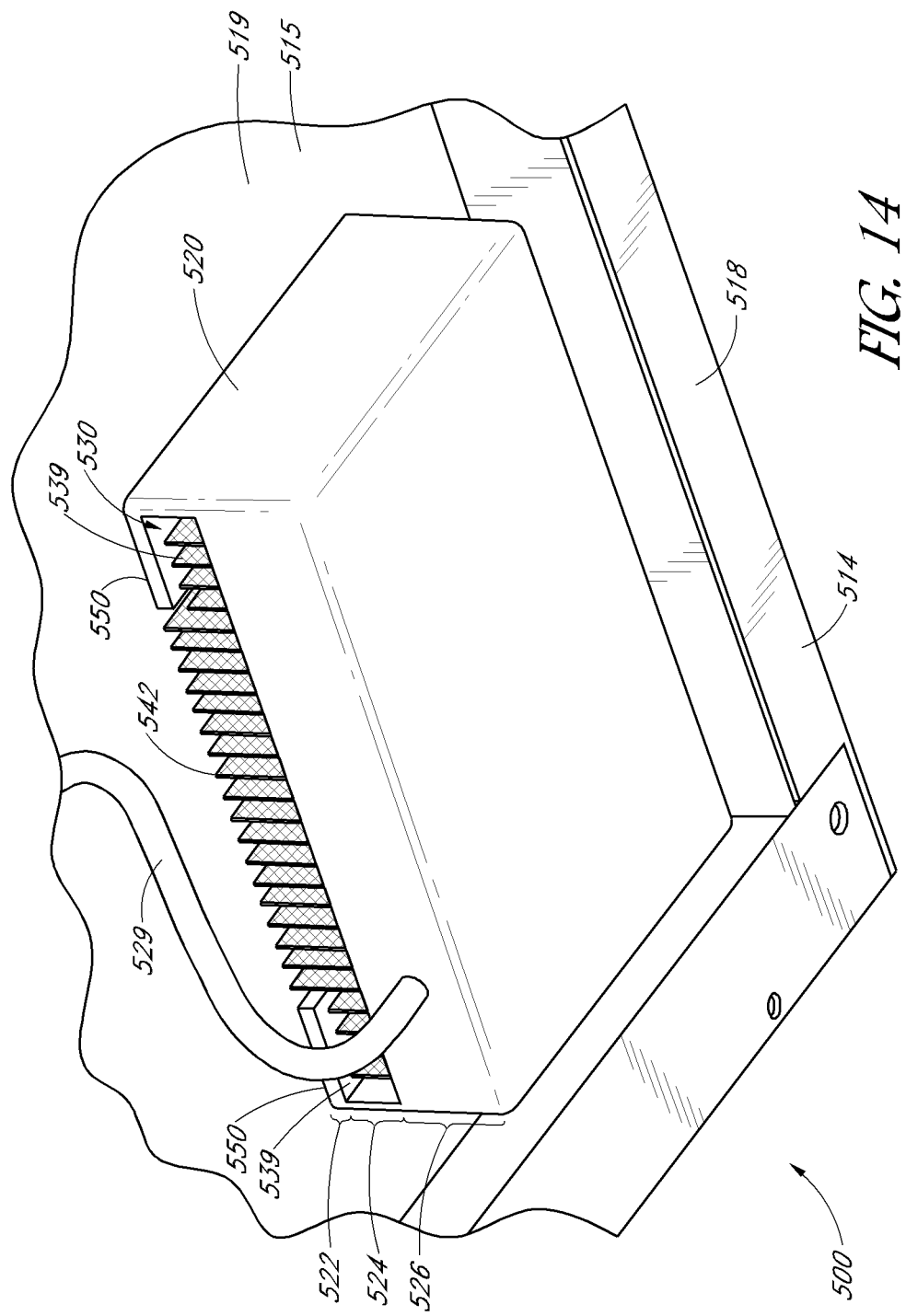
FIG. 14 is a schematic perspective view of the photovoltaic assembly of FIG. 13 in accordance with another embodiment.

FIG. 14 illustrates a schematic perspective view of the photovoltaic assembly 500 described in association with FIG. 13. The L-shaped structure 550 of the upper portion 522, the middle portion 524 with the first and second sets of air fins 540 and 542 in the opening 530, and the lower portion 526 are shown.

Figure 15:
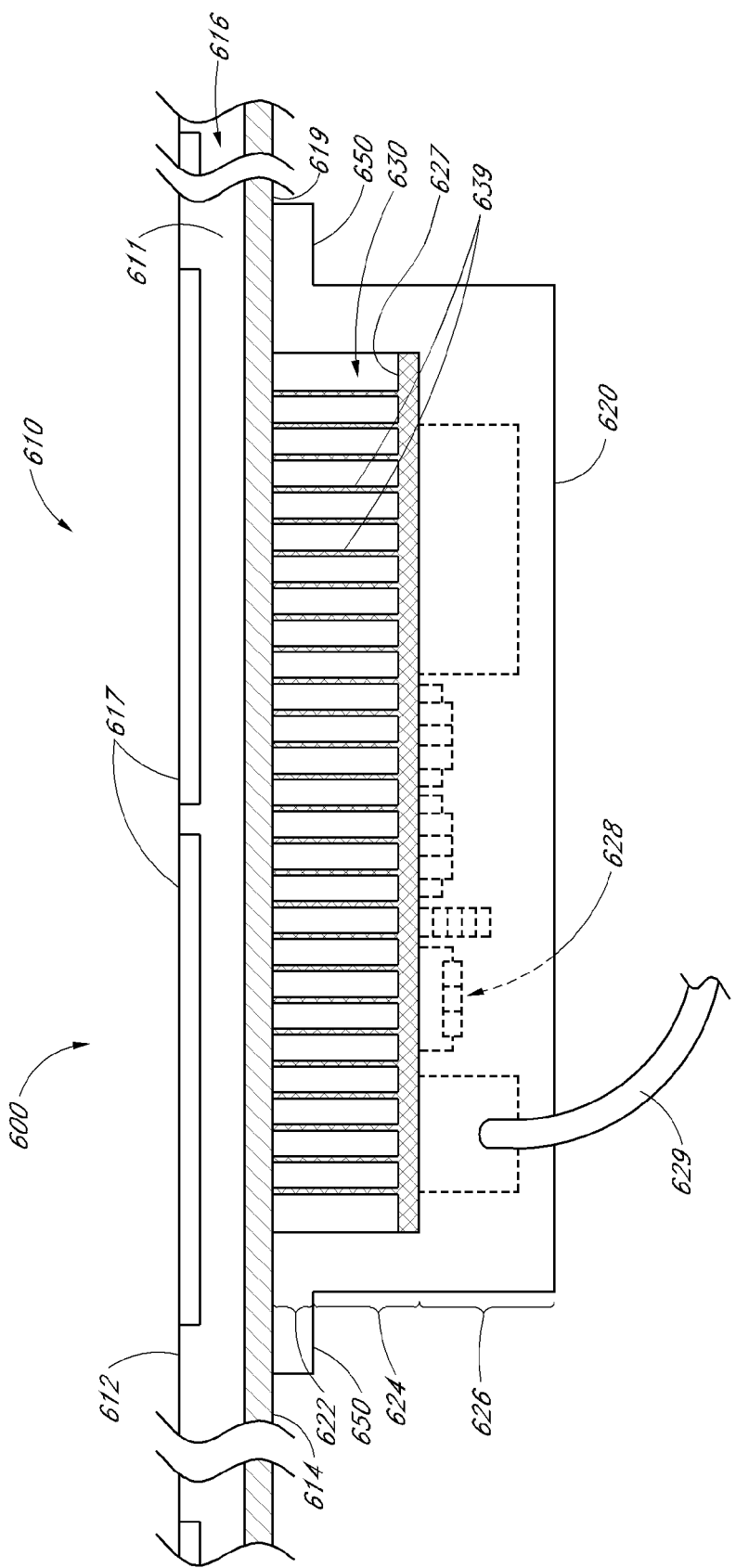
FIG. 15 is a schematic cross-sectional diagram of a photovoltaic assembly in accordance with yet another embodiment.

With reference to FIG. 15, a schematic cross-sectional diagram for another embodiment of a photovoltaic assembly 600 is shown. The photovoltaic assembly 600 is similar to the assemblies described in association with FIGS. 13 and 14. The upper portion 622 of an electronic component housing 620 has an L-shaped structure 650 extending from the lower portion 626 but, in contrast to the above described assembly, the L-shaped structure 650 bends outward to couple to a backsheet 619 of a photovoltaic module 610. The air fins 639 extend from the lower portion 626 to contact the backsheet 619. In one such embodiment, in an opening 630, at least one of the air fins 639 contacts the backsheet 619 to facilitate thermal communication between the backsheet and a heat sink 627, as depicted in FIG. 15.

Figure 16:
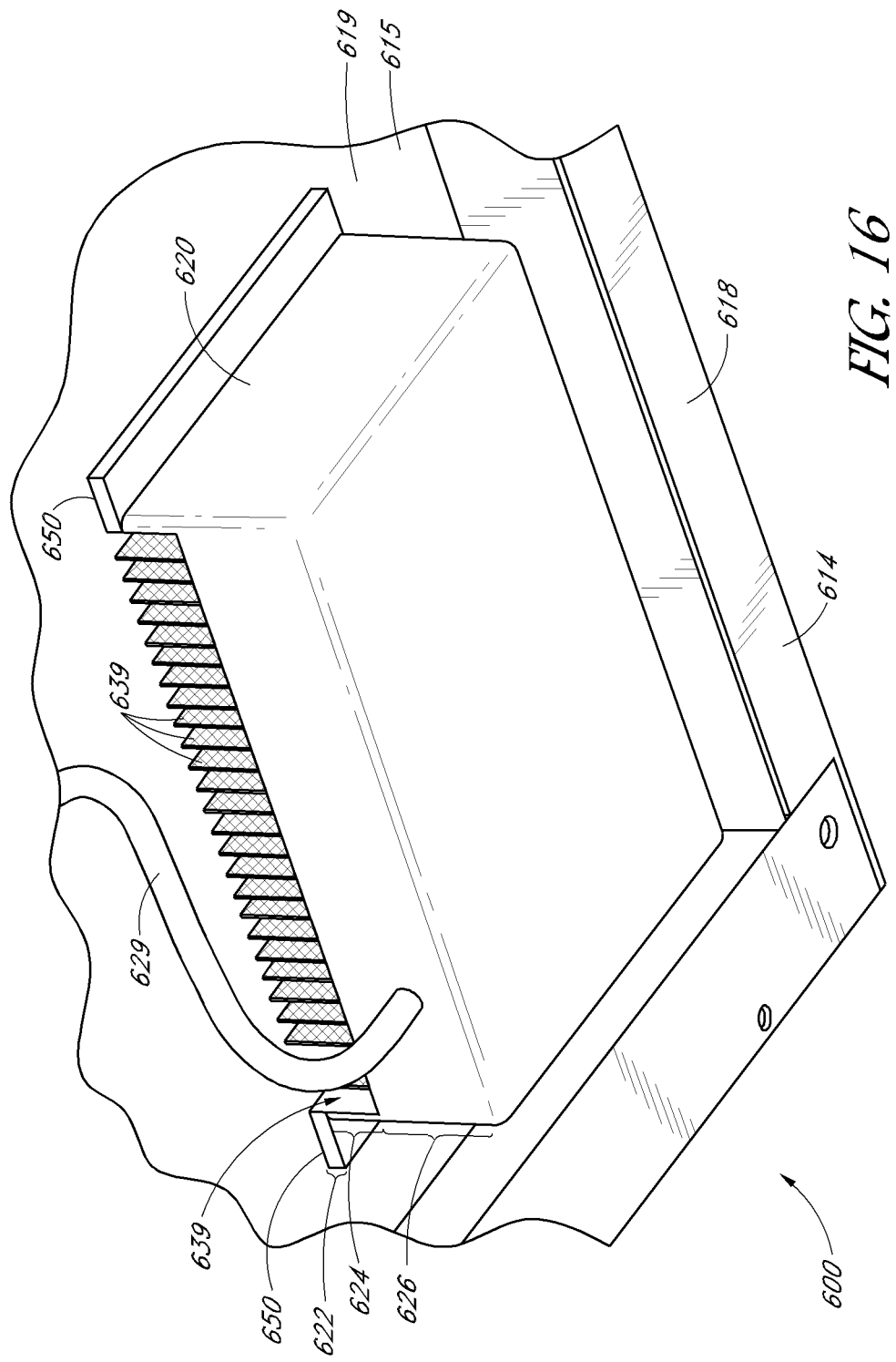
FIG. 16 is a schematic perspective view of the photovoltaic assembly of FIG. 15 in accordance with yet another embodiment.

FIG. 16 illustrates a schematic perspective view for the photovoltaic assembly 600 described in association with FIG. 15. The L-shaped structure 650, the middle portion 624 having air fins 639 extending and touching the backsheet 619, and the lower portion 626 are shown.

Figure 17:
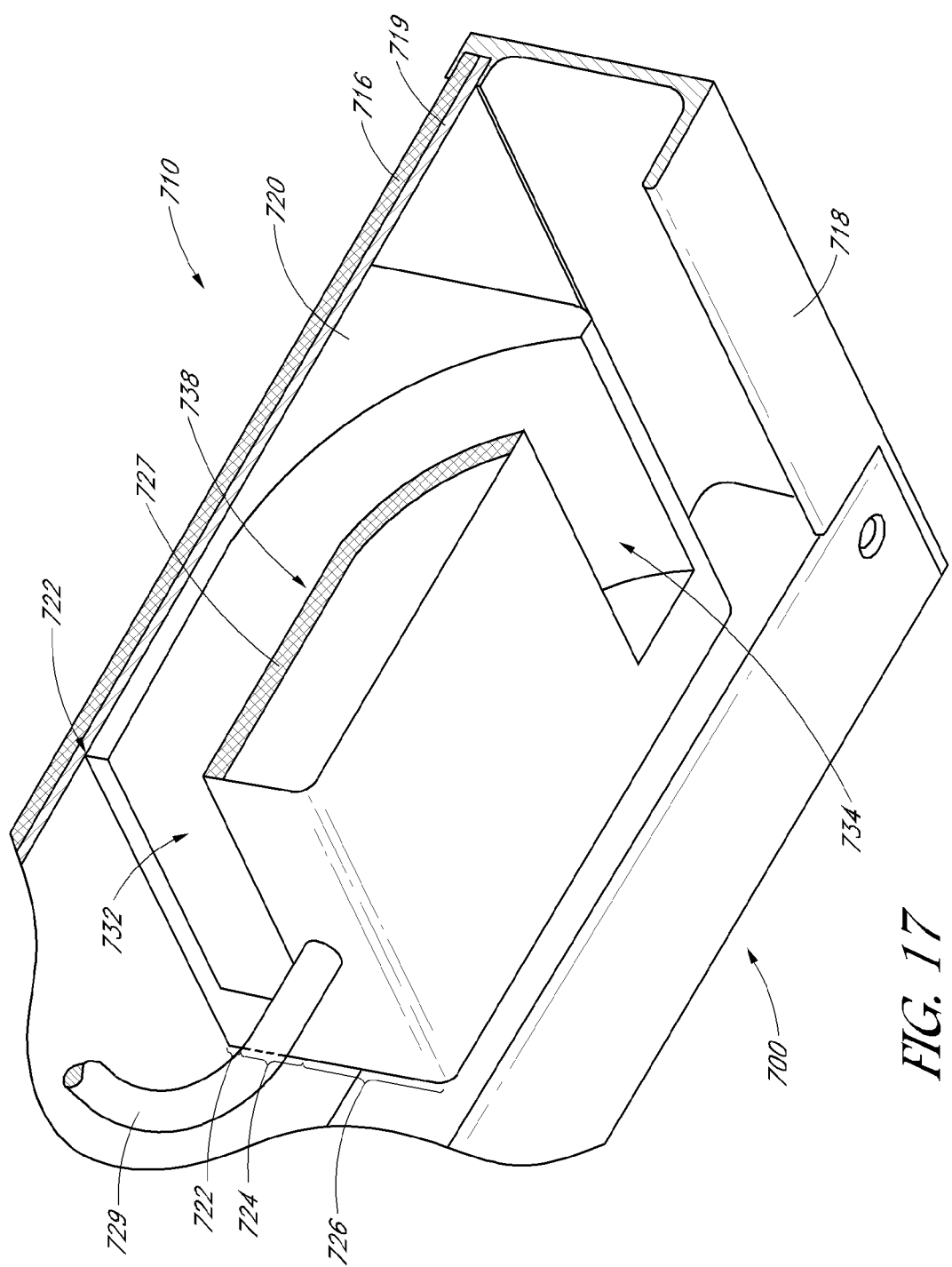
FIG. 17 is a schematic perspective view of a photovoltaic assembly in accordance with still another embodiment.

With reference to FIG. 17, a cross sectional and schematic perspective view for still another embodiment of a photovoltaic assembly 700 is shown. The photovoltaic assembly 700 is similar to the assemblies described in association with FIGS. 1-5. However, the middle portion 724 of an electronic component housing 720 has a first opening 732 originating between the upper portion 722 and lower portion 726 of the electronic component housing 720 and ending in a second opening 734 disposed between the upper portion 722 and lower portion 726 of the electronic component housing 720. A conduit 738 extends between the first and second openings 732, 734, and can include, as one wall of the conduit 738, at least a portion of the heat sink 727. Thus, heat exchange can occur between the heat sink 727 and air flowing through the conduit 738. This arrangement is in contrast to the assemblies described in association with FIGS. 1-5 wherein the opening is through-hole only. In an embodiment, the conduit 738 is curved, as depicted in FIG. 17. In some embodiments, including the illustrated embodiment, the middle portion 724 can include a curved heat sink 727. In some embodiments, air fins can extend from the heat sink 727 into the conduit 738, as well. In certain embodiments, at least one of the first opening 732, second opening 734, and the conduit 738 can include a fan or other forced air mechanism to direct air through the conduit 738 in a desired direction. In yet another embodiment, the conduit can split off into multiple conduits that can require any number of additional openings.

Figure 18:
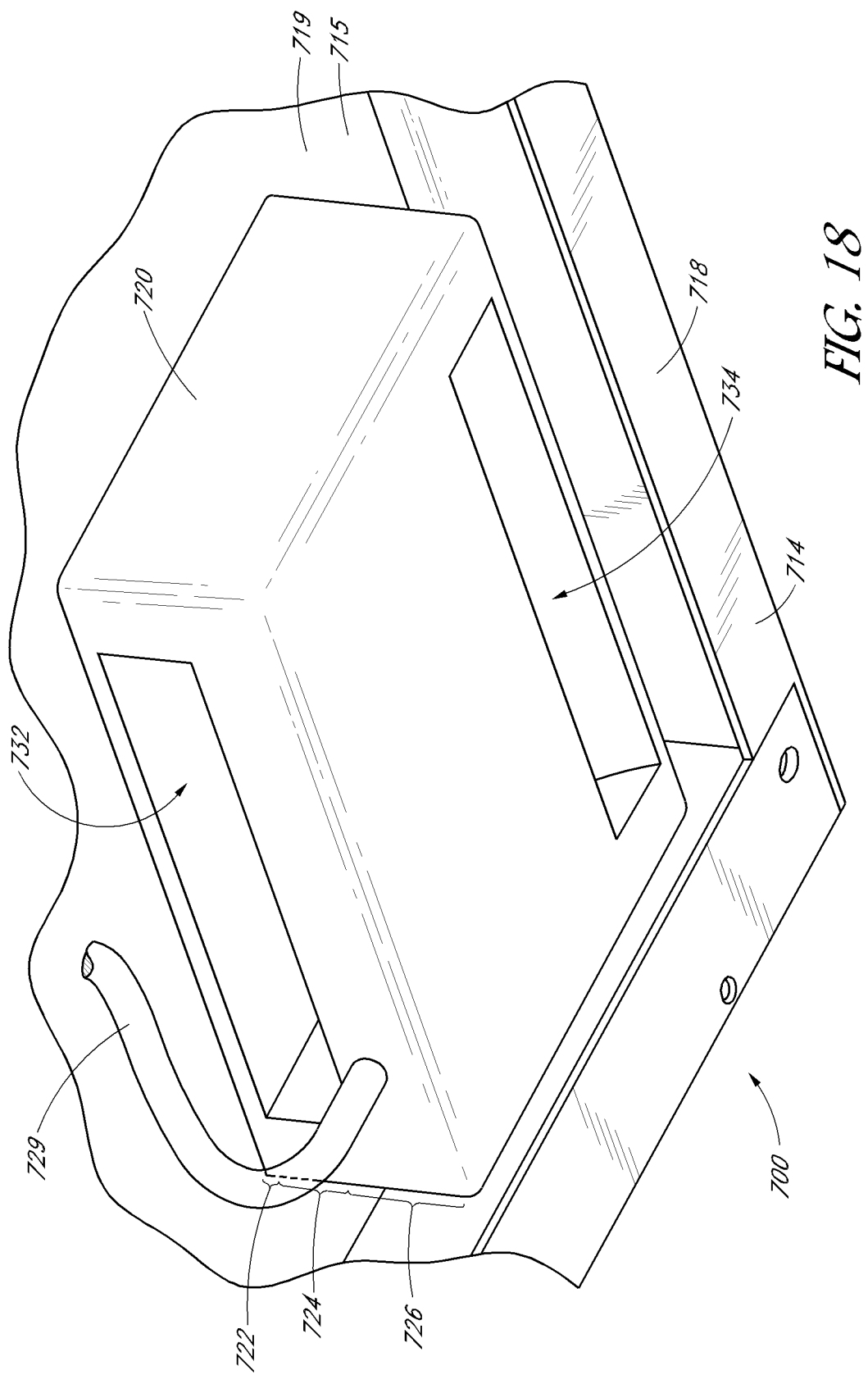
FIG. 18 is a schematic perspective view of the photovoltaic assembly of FIG. 17 in accordance with still another embodiment.

FIG. 18 illustrates a schematic perspective view for the photovoltaic assembly 700. The electronic component housing 720 includes an upper portion 722 coupled to the backsheet 719, a middle portion 724 and a lower portion 726. The middle portion 724 has a first opening 732 and the lower section 726 has a second opening 734. The conduit 738 extends between the first and second openings 732, 734.

Figure 19:
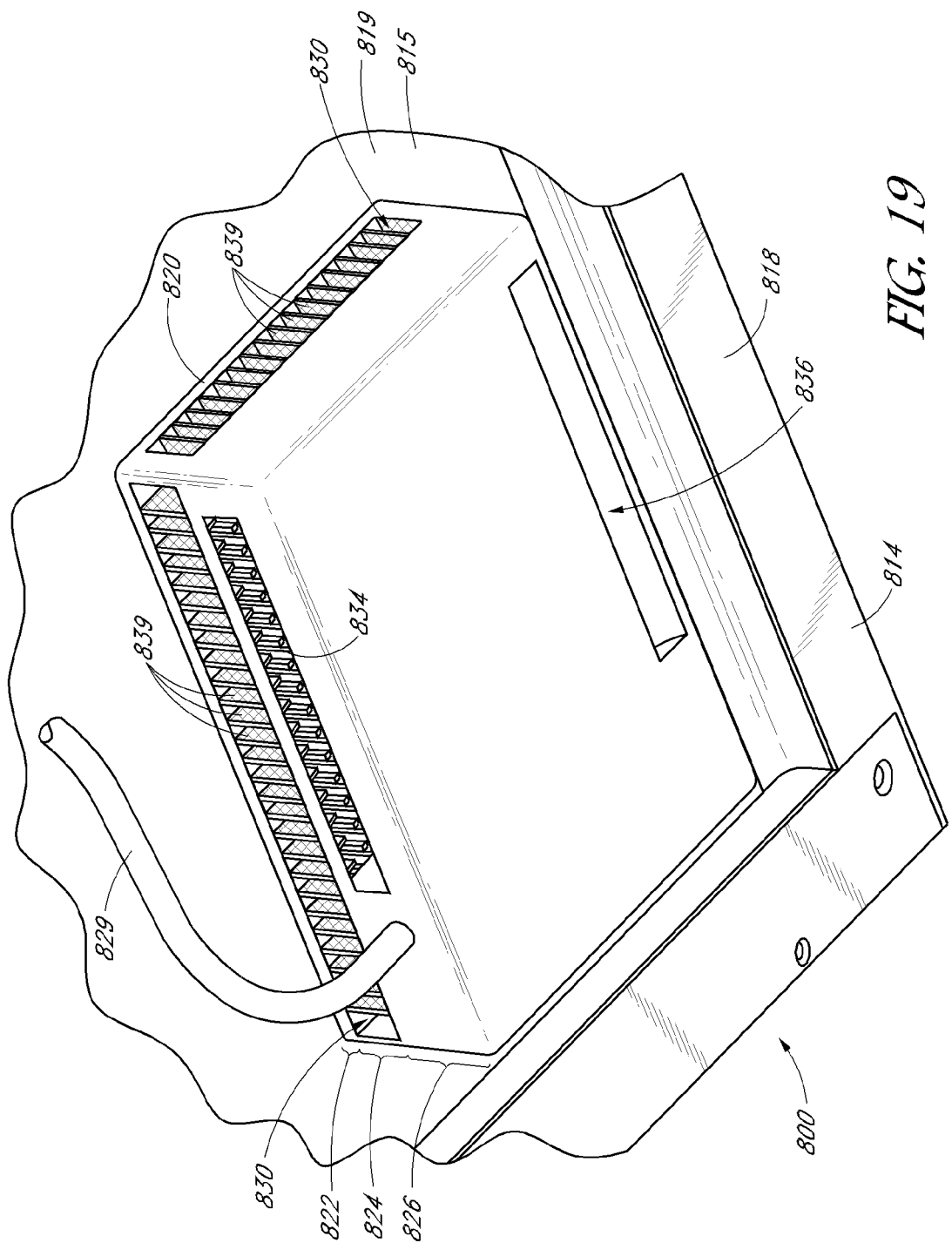
FIG. 19 is a schematic perspective view of a photovoltaic assembly in accordance with another embodiment.

With reference to FIG. 19, a schematic perspective view for yet another embodiment of a photovoltaic assembly 800 is shown. The photovoltaic assembly 800 is representative of a combination of the assemblies described in association with FIGS. 10, 17 and 18. The electronic component housing 820 has an upper section 822 coupled to a backsheet 819, a middle section 824 and a lower section 826. The electronic component housing 820 has a plurality of air fins 839 extending from the heat sink 827 and protruding into airspace communicating with opening 830 in the middle section 824. The lower section 826 has a first opening 834 from the area of the electronic component housing 820 perpendicular to the backsheet 819, and a second opening 836 on the area parallel to the backsheet 819.

FIG. 20 illustrates a schematic perspective cross-sectional view for the photovoltaic assembly 800. This view shows a diagonal air channel or conduit 838 allowing the first opening 834 and second opening 836 to be connected with the air fins 839.

In an alternative embodiment, a diagonal channel is curved similar to the assemblies described in association with FIGS. 17 and 18. In another embodiment, the photovoltaic assembly 800 provides an active cooling system mounted on the first opening 836, second opening 834 or opening 830. The active cooling system can be used to direct air into or out from the electronic component housing 820.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A photovoltaic assembly comprising:
 a photovoltaic module having a front side that faces the sun during normal operation and a back side opposite the front side, the photovoltaic module comprising:
  a frame of the photovoltaic module;
  a plurality of solar cells on the front side disposed within the photovoltaic module; and
  a backsheet on the back side of the photovoltaic module; and
 an electronic component housing comprising:
  an upper portion coupled to the backsheet of the photovoltaic module;
  a lower portion enclosing an electronic component; and
  a middle portion comprising:
   a heat sink in thermal communication with the electronic component, the heat sink disposed between the backsheet and the electronic component; and
   an opening in the electronic component housing between the upper portion and lower portion, the opening permitting fluid communication between the heat sink and an ambient environment.

2. The photovoltaic assembly of claim 1, wherein the electronic component comprises a microinverter for converting direct current generated from the solar module into alternating current and outputting alternating current.

3. The photovoltaic assembly of claim 1, wherein the electronic component comprises an electronic junction box.

4. The photovoltaic assembly of claim 1 further comprising a heat conductive adhesive between the upper portion of the electronic component housing and the backsheet.

5. The photovoltaic assembly of claim 1, wherein the electronic component is distributed within the middle portion of the electronic component housing.

6. The photovoltaic assembly of claim 1 further comprising a plurality air fins distributed within the opening in the electronic component housing.

7. The photovoltaic assembly of claim 1, wherein the electronic component comprises an electronic DC to DC optimizer.

8. The photovoltaic assembly of claim 7 further comprising a plurality of air fins distributed within the plurality of openings.

9. The photovoltaic assembly of claim 1, wherein the electronic component housing comprises aluminum or a heat dissipating polymer.

10. The photovoltaic assembly of claim 1, wherein the backsheet of the photovoltaic module comprises a glass or a plastic polymer.

11. The photovoltaic assembly of claim 1, wherein the photovoltaic module comprises a photovoltaic concentrator.

12. A photovoltaic assembly comprising:
 a photovoltaic module having a front side that faces the sun during normal operation and a back side opposite the front side, the photovoltaic module comprising:
  a plurality of solar cells on the front side disposed within the photovoltaic module; and
  a backsheet on the back side of the photovoltaic module; and
 an electronic component housing comprising:
  an upper portion coupled to the backsheet of the photovoltaic module;
  a lower portion enclosing an electronic component; and
  a middle portion comprising:
   a heat sink in thermal communication with the electronic component, the heat sink disposed between the backsheet and the electronic component; and
   an opening in the housing originating from the lower portion and ending in between the upper portion and lower portion, the opening permitting fluid communication between the heat sink and an ambient environment.

13. The photovoltaic assembly of claim 12 further comprising a heat conductive adhesive between the upper portion of the electronic component housing and the backsheet.

14. The photovoltaic assembly of claim 12 further comprising a plurality of air fins distributed within the opening in the housing.

15. The photovoltaic assembly of claim 12, wherein the opening in the housing originating from the lower portion and ending in between the upper portion and lower portion of the electronic component housing comprises a plurality openings.

16. The photovoltaic assembly of claim 15 further comprising a plurality of air fins distributed within the plurality of openings.

17. A photovoltaic assembly comprising:
 a photovoltaic module having a front side that faces the sun during normal operation and a back side opposite the front side, the photovoltaic module comprising:
  a frame of the photovoltaic module;
  a plurality of solar cells on the front side disposed within the photovoltaic module; and
  a backsheet on the back side of the photovoltaic module; and
 an electronic component housing comprising:
  a lower portion enclosing an electronic component;
  an upper portion comprising an L-shaped structure extending from the lower portion and bending inward to couple to the backsheet of the photovoltaic module; and
  a middle portion comprising:

a heat sink in thermal communication with the electronic component, the heat sink disposed between the backsheet and the electronic component;

an opening in the housing between the upper portion and lower portion, the opening permitting fluid communication between the heat sink and an ambient environment; and a plurality of air fins extending from the lower portion to contact the backsheet between the L-shaped structure allowing heat transfer from the backsheet to the heat sink.

18. The electronic device of claim 17 further comprising a heat conductive adhesive between the upper portion of the electronic component housing and the backsheet.

19. The photovoltaic assembly of claim 17, wherein the opening in the electronic component housing comprises a plurality of openings in the electronic component housing.

20. The photovoltaic assembly of claim 17, wherein the upper portion comprising the L-shaped structure extending from the lower portion and bending inward comprises an L-shaped structure extending from the lower portion and bending outward to couple to the backsheet of the photovoltaic module.

21. The photovoltaic assembly of claim 1, wherein the heat sink comprises a base portion proximate the lower portion, wherein the opening is disposed between the upper portion and the base portion of the heat sink.

22. The photovoltaic assembly of claim 1, wherein the opening is disposed between the backsheet and the electronic component.

23. The photovoltaic assembly of claim 1, wherein the entire heat sink is disposed between the backsheet and the electronic component.

24. The photovoltaic assembly of claim 1, wherein the heat sink has a lower side facing the electronic component and an upper side opposite the lower side, wherein the entire electronic component is disposed below the lower side of the heat sink.

* * * * *